United States Patent [19]

Hara

[11] Patent Number: 5,406,521
[45] Date of Patent: Apr. 11, 1995

[54] SEMICONDUCTOR MEMORY DEVICE AND DATA ERASE METHOD FOR IT

[75] Inventor: Hideki Hara, Tokyo, Japan
[73] Assignee: NEC Corporation, Tokyo, Japan
[21] Appl. No.: 143,737
[22] Filed: Nov. 1, 1993

[30] Foreign Application Priority Data

Oct. 30, 1992 [JP] Japan .................................. 4-316451

[51] Int. Cl.⁶ ........................................... G11C 13/00
[52] U.S. Cl. .................................... 365/218; 365/185; 365/900
[58] Field of Search ............... 365/185, 218, 900, 182, 365/226, 227, 228

[56] References Cited

FOREIGN PATENT DOCUMENTS 1-273296  1/1989  Japan .

OTHER PUBLICATIONS

N. Kodama et al., "A 5V Only 16 Mbit Flash EEPROM Cell Using Highly Reliable Write/Erase Technologies", VLSI Symp. 1991, pp. 75–76.
S. Aritome et al., "A Reliable Bi-Polarity Write-Erase Technology in Flash EEPROMS", IEDM 90, pp. 111–114.
Nikkei Microdevice, Mar., 1990, pp. 72–76.

Primary Examiner—Terrell W. Fears
Attorney, Agent, or Firm—Sughrue, Mion, Zinn, Macpeak & Seas

[57] ABSTRACT

A semiconductor memory device comprises a plurality of word lines (WL1, WL2), a plurality of bit lines (BL1, BL"), a plurality of memory cells (MC11, MC12) each includes a transistor (9) formed on a first semiconductor region (3) and having a floating gate (6), a control gate (8) connected to one of said word lines, a source region (5s) and a drain region (5d) connected to a first end of one of said bit lines, and further comprises a source line (SL) having a first capacitance thereof different from a second capacitance which is associated with said bit lines (BL1, BL2) and having a first end thereof connected to said source region, a first bias means (14) for charging said bit lins and said source line via said first semiconductor region to a high voltage level (Vcc) during a first time period and supplying a low voltage level (Vss) to said first semiconductor region during a second time period thereafter, wherein said low voltage level causes a voltage difference and a current between said source and drain region according to a difference between said first and second capacitance, by which current electrons are injected to said floating gate.

10 Claims, 6 Drawing Sheets

FIG. 1
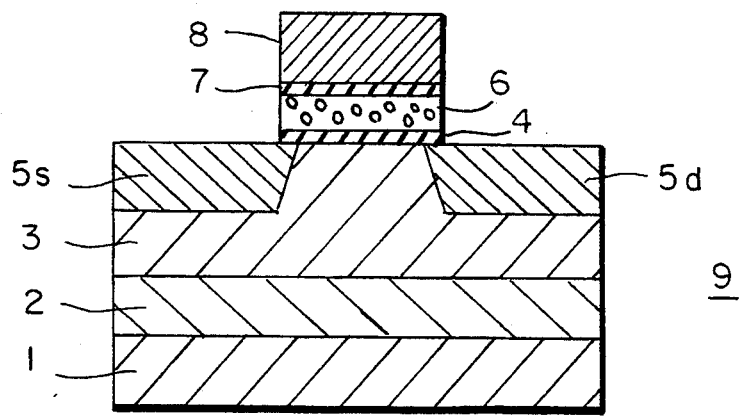
1-p TYPE SEMICONDUCTOR SUBSTRATE, 2-n WELL,
3-p WELL, 4-FIRST GATE INSULATING FILM, 5-n TYPE
IMPURITY DIFFUSION LAYER, 6-FLOATING GATE,
7-SECOND GATE INSULATING FILM, 8-CONTROL GATE,
9-MEMORY CELL TRANSISTOR.
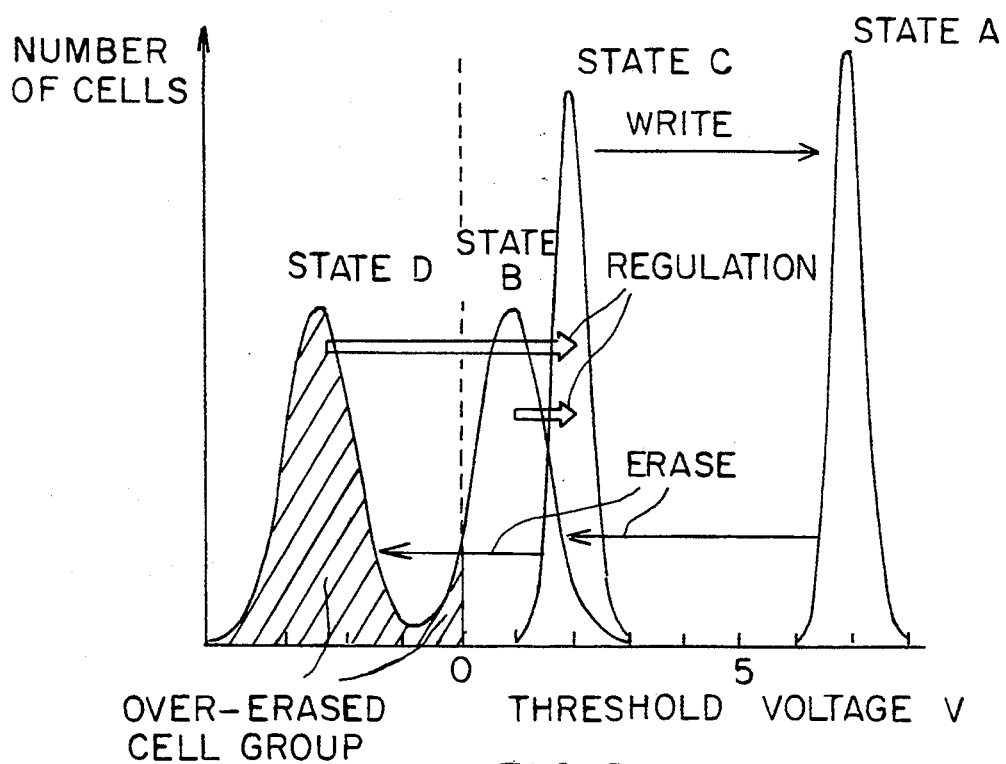
FIG. 5

| | BL1 | BL2 | SL | WL1 | WL2 | p-WELL | n-WELL | SUB |
|---|---|---|---|---|---|---|---|---|
| WRITE | 5 | 0 | 0 | 10 | 0 | 0 | 0 | 0 |
| READ | 1 | 0 | 0 | 5 | 0 | 0 | 0 | 0 |
| ERASE | 5 or * | 5 or * | 5 or * | -13 | 0 | 5 | 5 | 0 |
| THRESHOLD REGULATION | * | * | * | 5 | 0 | 5→0 | 5→0 or 5 | 0 |

UNIT : V       * : OPEN

91_p TYPE SEMICONDUCTOR SUBSTRATE, 92_FIRST GATE INSULATING FILM, 93_FLOATING GATE, 94_SECOND GATE INSULATING FILM, 95_CONTROL GATE, 96_ $n^+$ TYPE SEMICONDUCTOR REGION, 97_p TYPE SEMICONDUCTOR REGION, 98_ $n^-$ TYPE SEMICONDUCTOR REGION.

SEMICONDUCTOR MEMORY DEVICE AND DATA ERASE METHOD FOR IT

BACKGROUND OF THE INVENTION

The present invention relates to a semiconductor memory device and data elase method for it, in particular, to a Flash type Electrically Erasable and Programable Read Only Memory (Flash EEPROM) and a date erase method for Flash EEPROM.

Among the EEPROM devices, a certain type of device called Flash EEPROM which is capable of erasing data in a number of memory cells at the same time so as to achieve high speed operation has been developed. An example of the Flash EEPROM devices is described in N. Kodama, K. Saitoh, H. Shirai, T. Okazawa and Y. Hokari, "A 5 V only 16M bit Flash EEPROM Cell Using Highly Reliable Write/Erase Technologies", VLSI SYMP. 1991, pp. 75-76. According to that, a memory cell comprises a N-channel MOS transistor with a stacked type gate including a control gate and a floating gate, a write operation is achieved by using the channel hot electlon (CHE) injection to the floating gate whereas an elase operation is achieved by using the Fowler-Nordheim(FN) tunneling effect in which electrons are transported from the floating gate to a source region or a substrate. In S. Aritome, R. Shirota, R. Kirisawa, T. Endoh, R. Nakayama, K Sakui and F. Masuoka, "A RELIABLE BIPOLARITY WRITE/ERASE TECHNOLOGY IN FLASH EEPROMs", IEDM 90, pp. 111-114, there is proposed an another Flash EEPROM device in which the FN tunneling is applied to a write operation as well as an erase operation.

However, these Flash EEPROM devices have had in comonn a basic problem that some memory cell transistors are over-erased during the erase operation. In order to prevent it, a pre-write/erase-verify method has been adopted as described in, for example, NIKKEI MICRODEVICE, March, 1990, pp. 72-76, or Japanese patent application, publication number: 01-273296. This problem and the pre-write/erase-verify method will be described with reference to FIGS. 9-12.

FIG. 9 shows a typical structure of memory cell transistors used in a Flash EEPROM. FIG. 10 shows threshold voltages of the memory cell transistors. While a non-written memory cell transistor has a threshold voltage of about 2 V, since electrons are transported to a floating gate by a CHE injection or an FN tunneling during a write operation, a written memory cell transistor has a threshold voltage of about 7 V. In this case, the power supply voltage of the device is 5 V as shown in FIG. 10. So that when a memory cell is selected and a control gate of a memory cell transistor becomes at 5 V, the memory cell transistor becomes conductive or non-conductive in accordance with whether it is written or not, and when the memory cell is not selected and the control gate is at 0 V, the transistor is in non-conductive state. During a erase operation, the electrons in a floating gate are transported to a source region or a substrate by FN tunneling so that a threshold voltage of a written memory cell transistor is decreased to around 2 V, preferably the same voltage as that of non-witten transistors. Therefore, because of the FN tunnelings applied to the erase operation which requires very small currents, the erase operation can be performed for a number of memory cells at the same time so that it is possible to increase the operation speed of the device.

However, in the erase operation, some of memory cell transistors are over-erasedand and become in depression states having negative threshold voltages. In this condition, the over-erased memory cell is continuously in a conductive state regardless of whether or not it is selected and the device fails to function properly.

In order to prevent such a problem, according to the pre-write/erase-verify method, memory cells are written in advance to a erase opertion. This pre-write poeration is performed by using the FN tunneling effect with reducing the current consumption so that it can be applied to all memory cells, or particular memory cells which correspond to certain blocks of the device or so, at the same time. Owing to this operaion, the threshold voltages of the non-written memory cell transistors are raised as shown in FIG. 11. However, since the gate insulating films through which the FN tunneling effect is performed are very thin oxide films which tend to vary through manufacturing processes in their certain properties such as thicknesses and involve oxide ridges, it is difficult to achieve the FN tunnelings uniform in amount of electron transportation for a number of memory cell transistors and the threshold voltages of the memory cell transistors after FN tunnelings vary from each other and are scattered in a broad range as shown in FIG. 11. Therefore, subsequently to the pre-write, in this prior art device, the erase operation is performed on a step-by-step basis with the erase-verify operations which are performed alternately with each step of the erase operation as shown in FIG. 12. During the erase-verify pperation, read out operations for all memory cells are peformed. If any memory cells are not erased, the erase operation is performed again. So that it is possible to adjust the threshold voltages within the range between the control gate voltages in a selected and a non-selected states, that is, 0 V and 5 V as shown in FIG. 11.

Accordingly, since the pre-write operation is performed by using the FN tunneling effect which requires considerably long time and a high voltage in order to raise the threshold voltage of the non-written transistors so high, near to that of written transistors, the operation speed of the device is decreased and the circuits becomes large. Moreover, since the erase-verify operations are needed, the operation speed of the device is highly decreased and current consumption becomes large. Furthermore, since the prior art device is applied with the FN tunneling effect twice, that is, FN tunneling pre-write and FN tunneling erase, the variance of the threshold voltages after the erase operation becomes considerably large so that it may be occur that some memory cell transistors are not erased and/or some others are over erased after the erase operation.

SUMMARY OF THE INVENTION

Therefore a main object of the invention is to provide a semiconductor memory device capable of achieving a high speed erase operation for a plurality of memory cells at the same time with a small circuit area and a small current consumption. Another object of the invention is to provide a data erase method for a semiconductor memory device which is applicable to a number of memory cells at the same time and quickly which requires only a small current consumption and a amall circuit area.

According to this invention, a semiconductor memory device comprises a plurality of memory cells each includes a transistor formed on a semiconductor region and having a floating gate, a control gate, a source region connected to a first capacitance, a drain region connected to a second capacitance which is different from the first capacitance, a bias means for charging the first and second capacitances through the semicondictor region to a high voltage level and a control means for outputting a first and a second signal to said first bias means consecutively, wherein said bias means is activated by said first signal to charge said first and second capacitances, said bias means is deactivated to supply a low voltage level to said semiconductor region. According to this configuration, owing to a difference between the first and second capacitances, a voltage difference and a current occur between said source and drain region according to the second signal, by which current electrons are injected to said floating gate.

BRIEF DESCRIPTON OF THE DRAWINGS

FIG. 1 shows a cross-sectional view of a memory cell used in a semiconductor mempry device embodying the invention.

FIG. 5 is a graph showing threshold voltages of memory cell transistors of the first embodiment.

PREFERRED EMBODIMENTS

Figure 2:
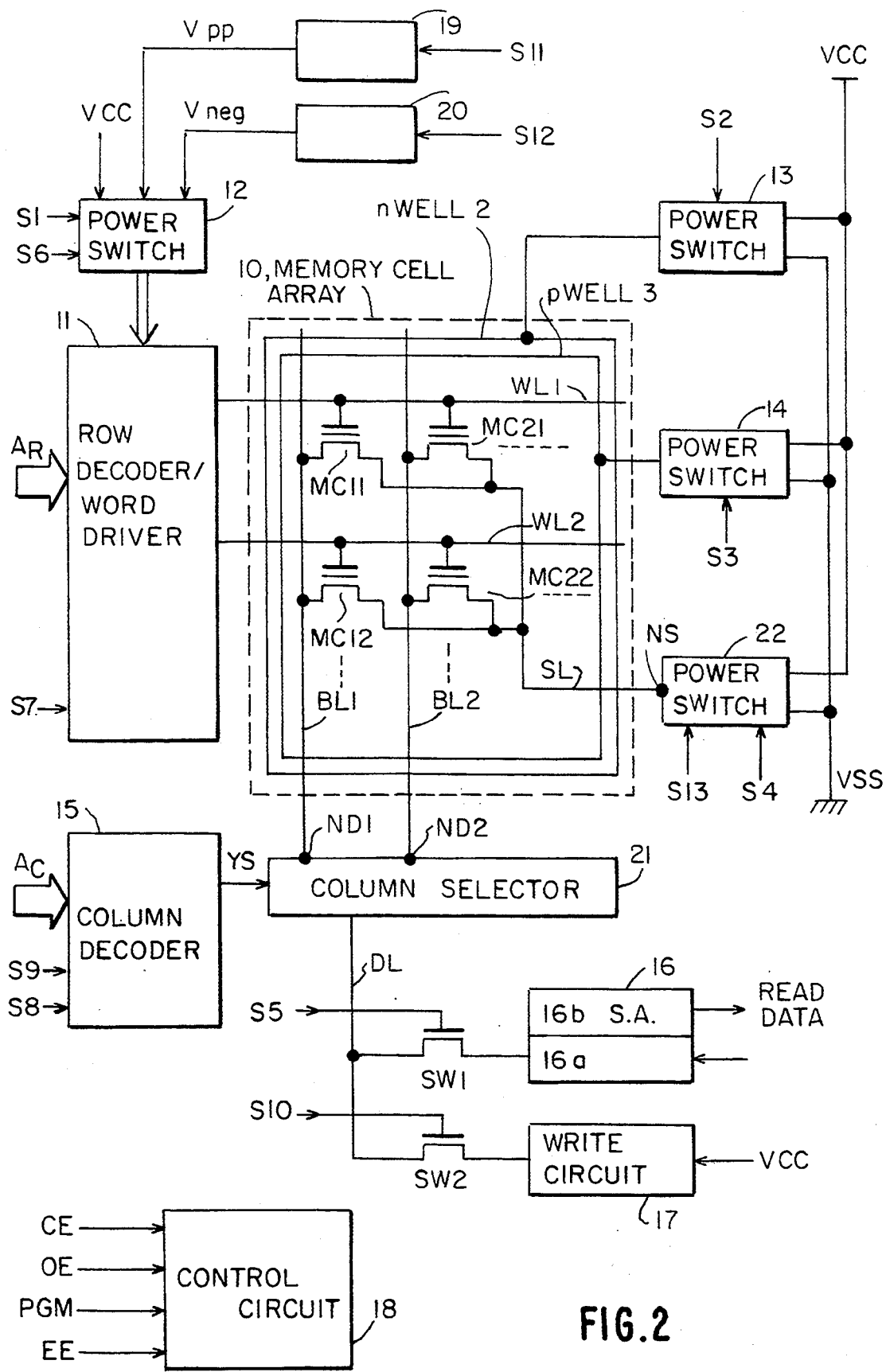
FIG. 2 is a block diagram of the device of the invention.

As shown in FIG. 1, a memory cell used in a memory device of first embodiment comprises a n-channel MOS transistor having stacked type gate 9 and formed on a p-well 3. The memory cell is fabricated as follows. An n-well 2 is formed on a p-type semiconductor substrate 1 and a p-well 3 is formed on the surface of the n-well 2. On the p-well 3, a first gate insulating film 4 comprising sillicon oxide and having its thickness about 100 angstroms is formed. On the first gate insurating film 4, a polycrystalline sillicon film having thickness of about 1000 to 2000 angstroms is grown by chemical vapor deposotion (CVD) for forming a floating gate 6 on which a second gate insulating film 7 comprising silicon oxide and having a thickness of about 150 to 250 angstroms is formed. After that a polycrystalline sillicon layer or a lamination layer of polycrastalline sillicon and high melting point silicide which has a thickness of about 1000 to 4000 angstroms is grown on the second gate insulating film 7 for forming a control gate 8. Then, the surface of the substrate is patterned by using photolithography technique to form the stack type gate 9 which works as a patterning mask during an ion-injecton step thereafter in which n-type diffused regions are formed on the substrate as a source region 5s and a drain region 5d.

According to FIG. 2, in the semiconductor memory device, memory cells MC11, MC12 are arranged in rows and columns to form a matrix in a cell array 10 each of which has its control gate connected to one of word lines WL1, WL2 and its drain to one of bit lines BL1, BL2. The word lines WL1, WL2 and the bit lines BL1, BL2 are formed by aluminium wirings. The word lines WL1, WL2 are connected to a row decoder/word driver circuit 11 to which the power switch circuit 12 supplies the voltages Vcc, Vpp, Vneg according to control signals S1, S6. The power voltages Vpp and Vneg are generated by a boost circuit 19 according to a control signal S11 and by a negative voltage boost circuit 20 according to a control signal S12 respectively. The voltages Vpp, Vneg are about 9 V to 15 V and about −10 V to −15 V respectively whereas the power source voltage Vcc is 5 V. The bit lines BL1, BL2 are selectively connected to a data line DL through a column selector 21 according to an output signal of the column decoder 15 which is supplied with the column address signal AC. The data line DL is connected to a read circuit 16 according to a control signal S5 or to a write circuit 17 according to a control signal S10. The read circuit 16 includes a bias circuit 16a and a sense amplifier circuit 16b. The source regions of the memory cell transistors are connected to a source line SL which is formed as a impurity diffusion layer and selectively connected through a power switch circuit 22 to a power source line Vcc or Vss according to a control signal S2. The p-well 3 is connected to the power switch circuit 13 which is supllied with the voltages Vcc, Vss and selictively out put them according to the control signal S2. The n-well 2 is connected to the power switch circuit 13 which selectively outpits the voltages Vcc, Vss according to the control signals S3. Each control signal S1 to S13 is provided from a control circuit 18 which is supplied with external input signals CE, OE, PGM, EE.

Figure 3:
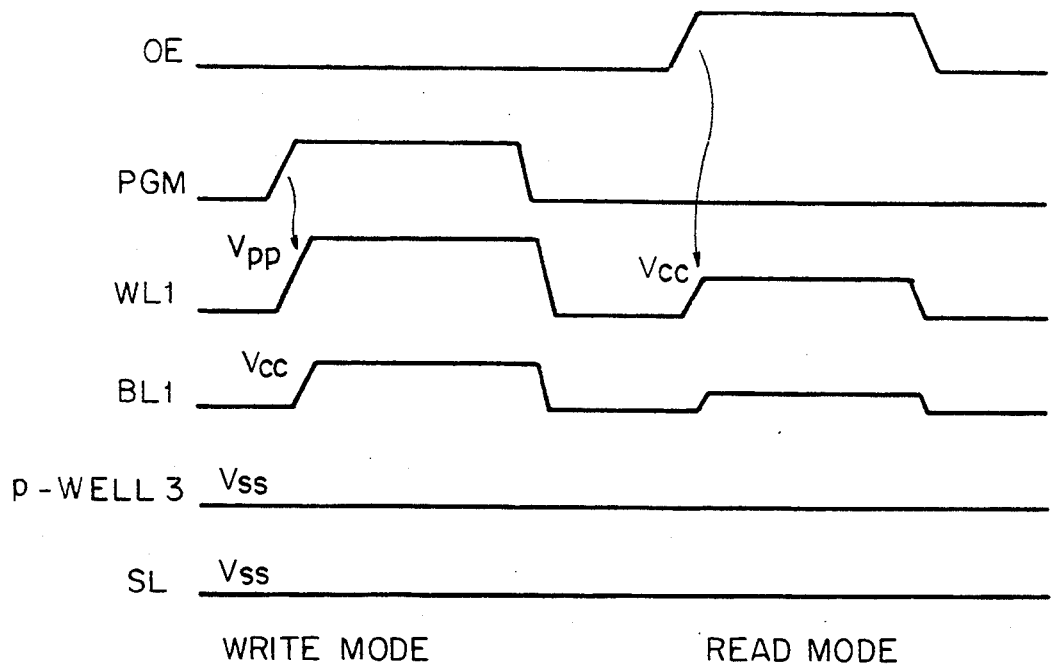
FIG. 3 is a chart showing the write and the read operation timings in the first embodiment.

When a external input signal PGM goes to its high level, that indicates a write operation mode as shown in FIG. 3, the control signal S11 goes to "high" for activating the boost circuit 19 to output the voltage Vpp. The control signals S1 and S6 go to "high" so that the power switch circuit 12 selects the vontage Vpp and supplies it to the row decoder/word driver circuit 11 which drives one of the word lines WL1, WL2 to the voltage Vpp according to a row addrss signal AR. Meanwhile, the control signals S2, S3, S4 go to "low" so that the n-well 2, the p-well 3 and the source line SL are supplied with the ground voltage Vss via the power switch circuit 13, 14 and 22 respectively. Moreover, the signal S10 goes to "high" to connect the write circuit 17 which is supplied with the voltage Vcc to the column selector 21 which drives one of the bit lines BL1, BL2 according to a column address signal AC. Accordingly, in the selected memory cell MC11, voltages of the source 5s, the drain 5d, the control gate 8 and the p-well 3 are the ground voltage Vss, the power voltage Vcc, the high voltage Vpp and the ground voltage Vss respectively. Therefore, the hot electrons are generated in the vicinity of the boundary of the drain region 5d and injected into the floating gate 6 so that the transistor of the selected memory cell MC11 is written and changes its threshold voltage to about 7 V, indicated as the state A in FIG. 5, whereas that of non-written cell transistors is about 2 V, indicated as the state C in FIG. 5. In this case, the substrate 1 is continuously supplied with the voltage Vss.

When the signal OE goes to "high" that indicates a read mode, the control signals S1 and S6 go to "high" and "low" respectively so that the power switch circuit 12 supplies the voltage Vcc to the row decoder/word driver circuit 11 which drives selected one of word lines WL1, WL2 to the voltage Vcc, that is 5 V, as shown in FIG. 3. The memory cell transistors associated with the selected word line WL1 become conductive or non-conductive accoding to the threshold voltages thereof. The column selector 21 connects one of the bit lines BL1, BL2 to the data line DL which is connected to the read circuit 16 when the signal S5 goes to "high". The bias circuit 16a in the read circuit 16 supplies to the column selector 21 with a read voltage, that is about 1 V, so as to bias the selected bit line BL1. The sense amplifier 16b amplifies the voltage level appearing on the data line DL which is determined by whether or not the selected memory cell MC11 is conductive and outputs the read data. In this operation, the n-well 2, the p-well 3 and the source line SL are supplied with the voltage Vss.

Figure 4:
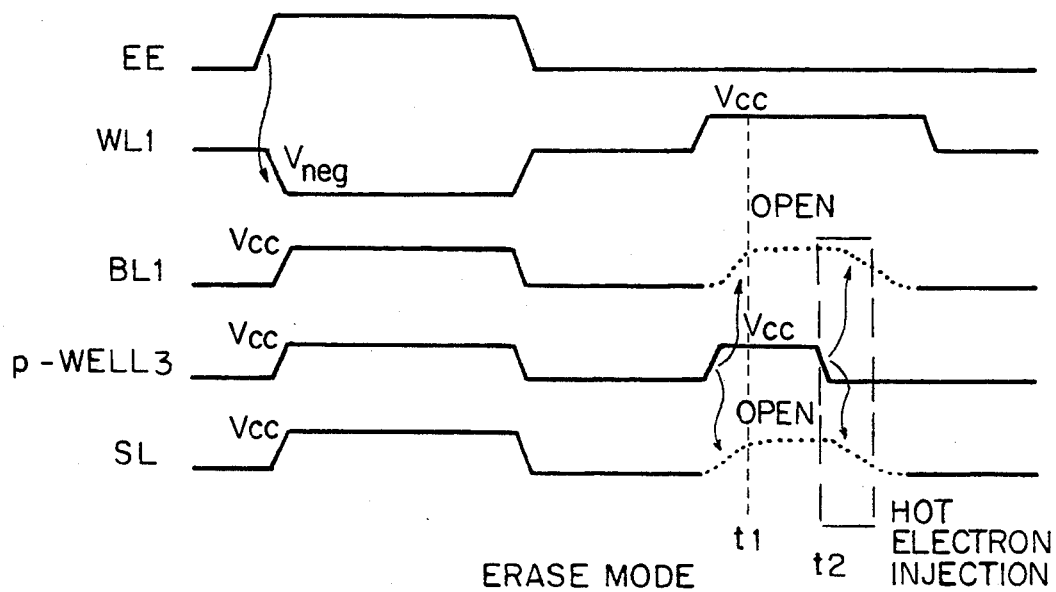
FIG. 4 is a chart showing the operation timings of the erase and the threshold voltage adjusting operations.

When the external input voltage EE goes to "high", that indicates the erase mode as shown in FIG. 4, the control signal S12 goes to "high" for activating the negative voltage boost circuit 20 to generate the negative voltage Vneg. The control signal S6 goes to "low" so that the power switch circuit 12 supplies the voltage Vneg to the row decoder/word driver circuit 11 which drive the all word lines WL1, WL2 to the voltage Vneg according to the control signal S7. Meanwhile, the control signals S2, S3 and S4 go to "high" and the power switch circuit 13, 14 and 22 supply the voltage Vcc to the n-well 2, the p-well 3 and the source line SL respectively. The column decoder 15 output the column selection sognal YS to the column selector 21 to select all bit lines BL1, BL2 according to the signal S9 so that the column selector 21 connects all bit lines BL1, BL2 to the data line DL which is supplied with the voltage Vcc by the write circuit 17. Therefore, the voltages of the source 5s, drain 5d, control gate 8 and the p-well 3 of each memory cell are Vcc, Vcc, Vneg and Vcc respectively so that the electrons in the floating gate 6 are extracted to the p-well 3 by the Fowler-Nordheim tunneling effect. In this case, the n-well 2, which is supplied with the voltage Vcc, prevents the bias between the n-well 2 and the p-well 3 and currents from the p-well 3 to the n-well 2 or p-type substrate 1 so that the voltage of the p-well 3 maintained stably. Owing to this erase operation, the written memory cell transistors decrease their threshold voltages to about 2 V, as indicated as the state B in FIG. 5. However, some of written memory cell transistors are over-erased to become in depression states and have negative threshold voltages, and almost all non-witten memory cell transistors are also over erased, as indicated as the state D in FIG. 5.

Therefore, subsequently to the erase operation, in the erase mode of this device, the threshold voltage regulating operation is performed as described below. In this operation, the n-well 2 and the p-well 3 are biased to have the voltage Vcc by the power switch circuit 13, 14 which are supplied with the signals S2, S3 being in "high" states. The power switch circuit 22 turns its output node NS connected to the source line SL in a high impedance state according to the control signal S13. The column selector 15 maintains the column selector 21 in a non-selection state according to the signal S8 in which the column selector 21 turns its all output nodes ND1, ND2 connected to the bit lines BL1, BL2 in high impedance states. Therefore the source line SL and all of the bit lines BL1, BL2 are maintained in the "open" states, in which the source line SL and the bit lines BL1, BL2 are not connected directly to any portion of the device and in floating states but are connected via their parasitic capacitances to certain portions around them in the device. The power switch circuit 12 supplies the voltage Vcc to the row driver/word driver circuit 11 according to the control signals S1, S6 which are in "low" and "high" states respectively. The row decoder/word driver circuit 11 drives all word lines WL1, WL2 to the voltage Vcc according to the control signal S7. Therefore, in this condition, the source region 5s of each memory sell transistor 9 and the source line SL are in the open states and charged by the p-well 3 owing to their parasitic capacitances to the voltage Vcc, while the drain regions 5d and the bit lines BL1, BL2 are also in open states and charged by the p-well 3 to the voltage Vcc because of their parasitic capacitances at the timing t1 as shown in FIG. 4.

After that, at the timing of t2, the control signals S2, S3 go to "low" to decrease the voltages of the n-well 2 and the p-well 3 respectively to the ground voltage Vss. So that the voltage levels of the source and the drain regions 5s, 5d are pulled down owing to the capacitance cupplings with the p-well 3. In this case, since the bit lines BL1, BL2 are formed by aluminium wirings whereas the source line SL is formed as a diffusion layer, and moreover, the bit lines BL1, BL2 are formed having small parasitic capacitances so as to transfer the read data quickly in a read operation whereas the source line SL is formed having a large capability for maintaining the source region 5s at the ground level so as to prevent the increase of its voltage level during a read mode and improve the speed of a read operation, the parasitic capacitances corresponding to the drain regions 5d are quite larger than those corresponding to the source regions 5s. Therefore, the voltage of the drain region 5d is quickly decreased with that of the p-well 3 whereas the voltage of the source region 5s maintains its high level so that the voltage differences between the source and the drain regions 5s, 5d are generated. Consequently, in a over-erased memory cell transistor, which is in a depression state, since a channel region between the source and the drain regions 5s, 5d are formed, a current is generated through the channel. The density of this channel current is determined by the registance of the channel, which depends on the voltage level of the floating gate 6. That is, the lower threshold voltage causes the more channel current. In this state, since the capability of the channel is not large in comparison with that of the capacitance cuppling between the source and the drain regions 5s, 5d and the p-well 3, the generation of the voltage differences are not prevented by the channel. The channel current causes hot electrons in the vicinity of the boundary of the source region 5s which are injected to the floating gate 6 according to the voltage difference between the floating gate 6 and the p-well 3. That is, the larger the transistor 9 has the voltage difference between the floating gate 6 and the p-well 3, the more the hot electrons are injected to the floating gate 6. Therefore, the memory cell transistor 9 which has the lower threshold voltage is more rendered to increase the threshold voltage so that the over-erased memory cell transistors are recovered. Moreover, since the the control gate 8 is drived to the voltage Vcc, the channel current between the source and the drain regions 5s, 5d are also occured in the memory cell transistores having positive threshold voltages. As a result, by performing the threshold voltage regulating operation, the memory cell transistors including all of over-erased transistors are converged on a certain positive threshold voltage which is determined by the voltages of the control gate 8 and the p-well 3.

That is, voltages of the control gate 8 and the p-well 3 in the regulating operation of this embodiment are not restricted to the values as described above, but the voltages can be changed in order to adjust the amount of hot electron injections and adjust the required level of the threshold voltage to which the threshold voltages of all transistors are regulated. For example, the higher voltage of the control gate 8 causes the more hot electron injections to the floating gate 6 and the higher threshold voltage after the regulating operation. Similarly, the higher voltage of the p-well 3 just before the shifting down to the ground voltage causes the more hot electrons and the more injections thereof.

Accordingly, since the threshold voltage regulating operation is performed by using the hot electron injections which takes a very short time, for example less than several ten milliseconds, the increase of the total operation time in the erase mode due to addition of this regulating operation is substantially negligible. Moreover, since the regulating operation is performed by using the small current owing to the parasitic capacitances of the bit lines and the source line, the increase of the current consumption of this device is also very small. Furthermore, the memory device of this invention, in the threshold voltage regilating operation, does not require the high voltage such as used in a write operation so that the circuit area for generating or controling the voltages are reduced. Furthermore, according to this embodiment, since it is unnecessary to perform any pre-write or erase-verify operations, the total erase mode time is considerably decreased and the operation speed of the device is highly improved.

Figures 6, 7:
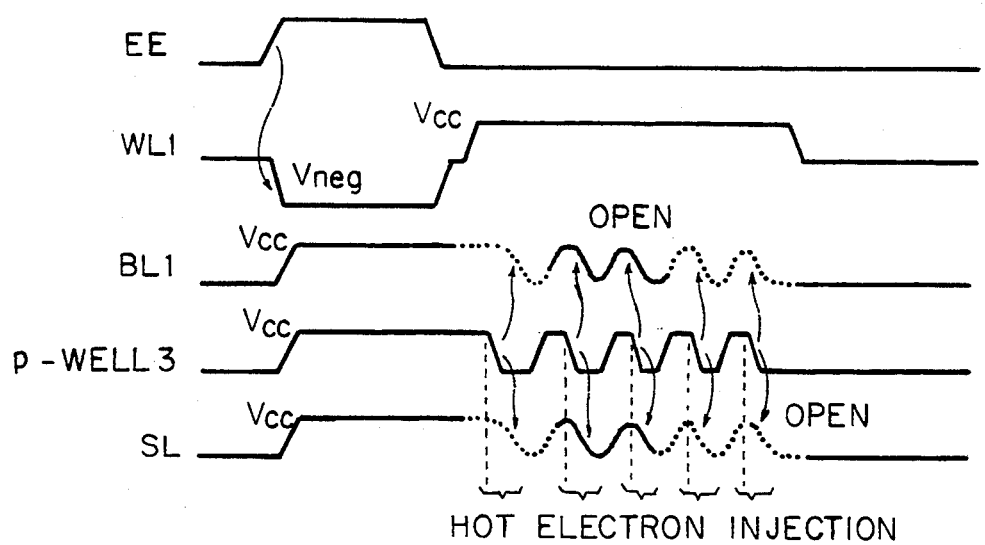
FIG. 6 is a table of voltages supplied to each part of the device in respective operation of the first embodiment.
FIG. 7 is a timing chart of the second embodiment.

In this embodiment, the bit lenes BL1, BL2 and the souce line SL are biased to the voltage Vcc during a erase operation but it is also possible to keep them in the "open" states according to the control signal S8 and S13 respectively. Furthermore, during the threshold voltage regulating operation, the n-well 2 can be maintaind at the voltage Vcc while the p-well 3 shifts its voltage down to the ground voltage Vss. In FIG. 6, the voltages applied to the word lines WL1, WL2, the bit lines BL1, BL2, the source line SL, the n-well 2, the p-well 3 and the substrate 1 in the above mentioned respective operations are shown.

Now the second embodiment of the invention will be described. As shown in FIG. 7, after the erase operation, the bit line BL1, BL2, the source line SL and the p-well 3 are maintaind at the voltage Vcc according to the control signals S9, S10, S4 and S3 untill the beginning of the regulating operation which is started as soon as the erase operation is finished. That is, when the voltages of the word lines WL1, WL2 turn back to the voltage Vss, the word lines WL1, WL2 are drived to the voltage Vcc and the bit lines BL1, BL2 and the source line SL are rendered to be "open" immediately. Therefore the operation speed in the erase mode is increased. Moreover, according to this embodiment, after the voltage of the word lines WL1, WL2 are increased to the voltage Vcc and the bit lines BL1, BL2 and the source line SL are opened, the voltage of the p-well 3 oscilates between the voltages Vcc and Vss several times according to the signal S3 so that the charging operation to the bit lines BL1, BL2 and the source line SL and the hot electron injection operation are performed cyclically. Therefore the threshold voltages of the memory cell transistors are more effectively converged to a certain value.

Figure 8:
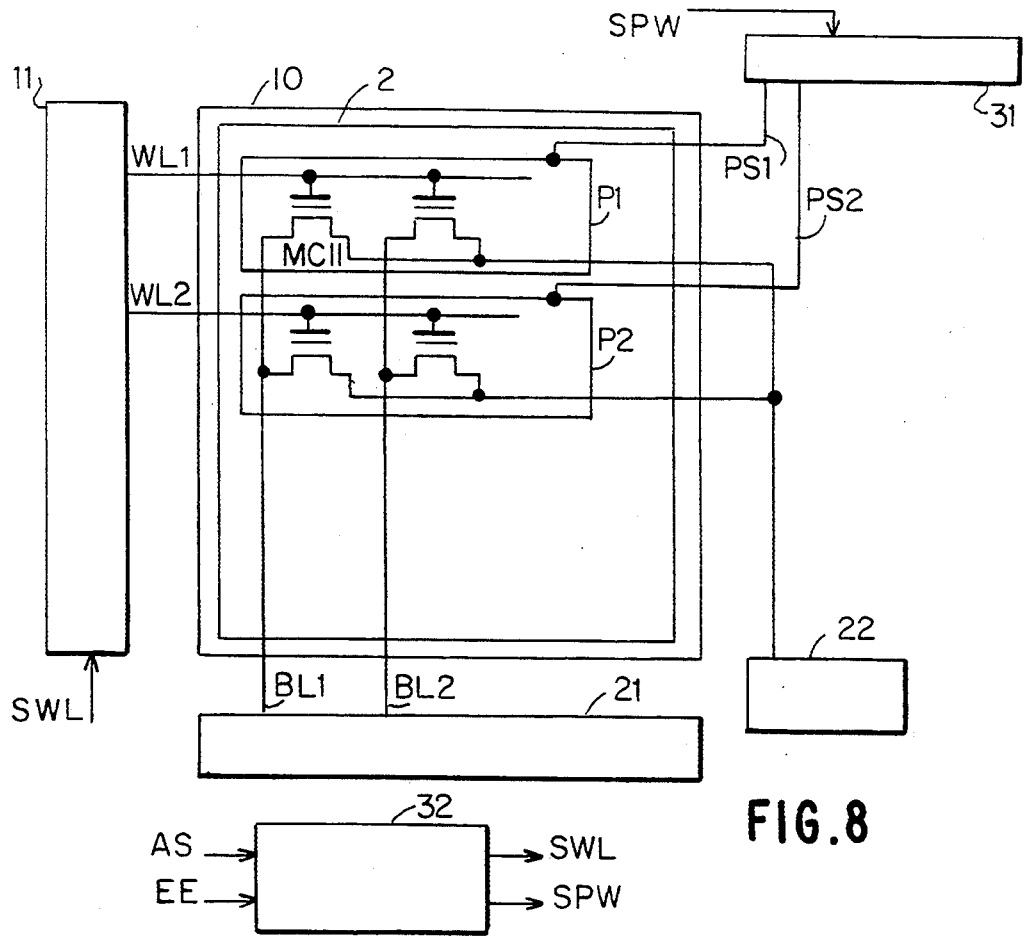
FIG. 8 is a block diagram of the third embodiment.
Figure 9:
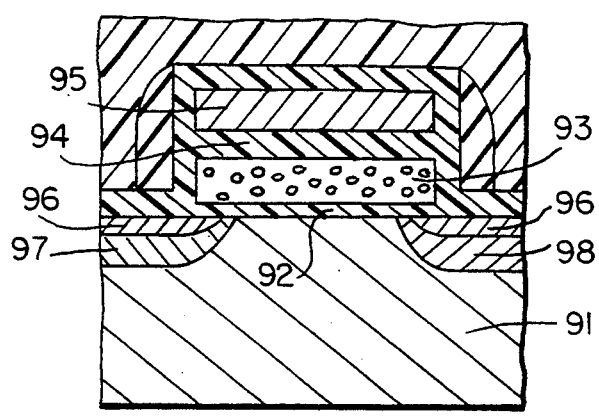
FIG. 9 shows a cross-sectional view of a typical memory cell transistor.
Figure 10:
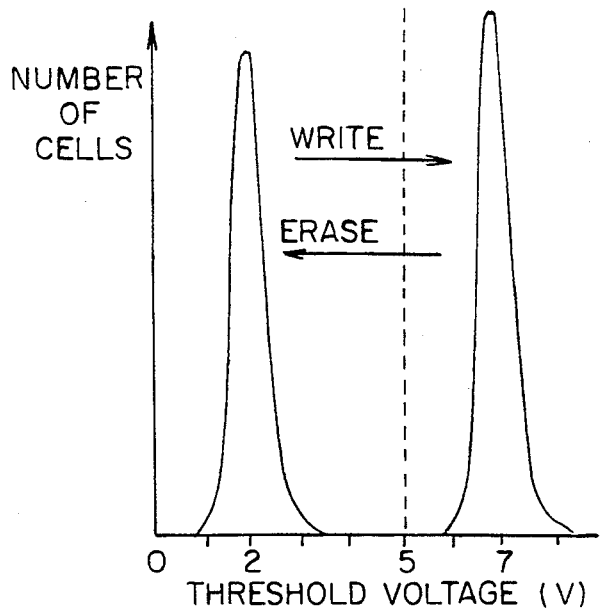
FIG. 10 shows a threshold voltages of the transistors used in a typical memory device.
Figure 12:
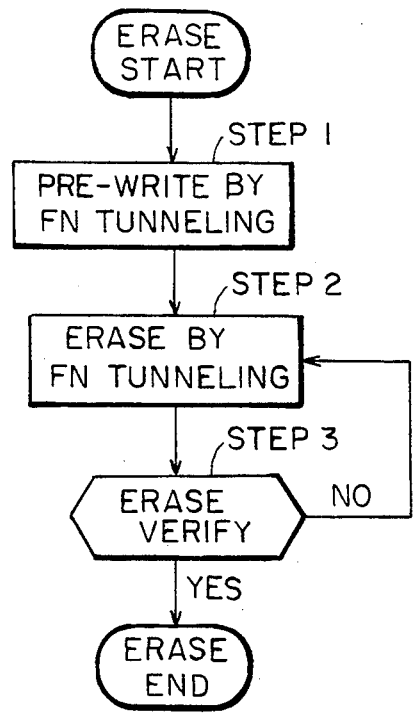
FIG. 12 is a flow chart of the pre-write and erase verify method.
Figure 11:
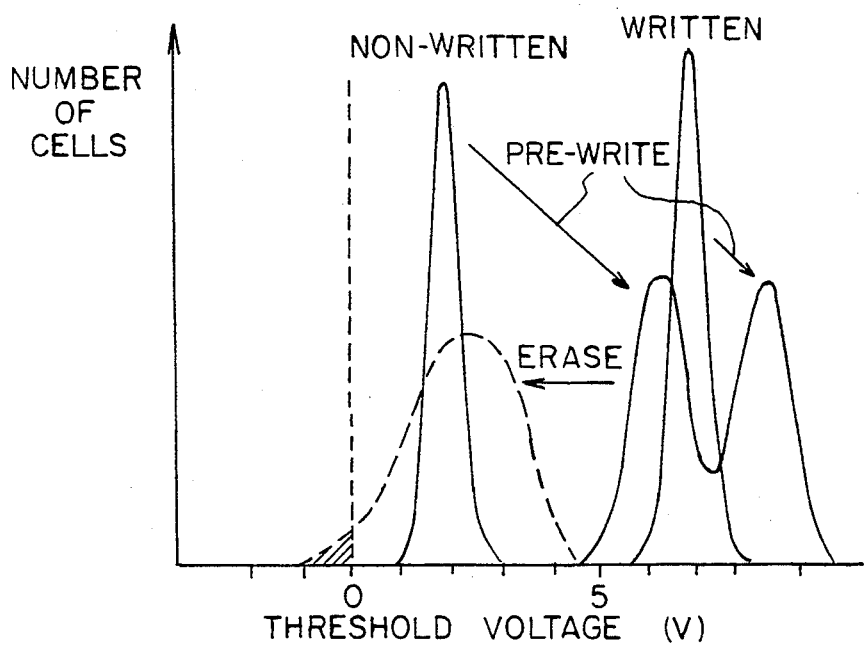
FIG. 11 is a graph showing a change in threshold voltage of a memory cell transistor according to a pre-write and erase verify method of the prior art.

Next is the third embodiment of the invention in which the device performs a erase operation on a particular group of memory cells. As shown in FIG. 8, a plurality of p-wells P1, P2 are formed in place of the p-well 3 as in the first embodiment. Each of the p-wells P1, P2 forms a certain group of the memory cells MC11 such as the sectors of the memory device. The p-wells P1, P2 are selected by the p-well selector circuit 31 to operate in such a mannar as in the first embodiment. The p-well selector circuit 31 is supplied with the the p-well selection signal SPW. The signal SPW is output from the erase selector circuit 32 in accordance with the erase address signal AS and the erase mode signal EE. The p-wells P1, P2 are maintained at the voltage Vss when they are not selected in the erase mode. Therefore, in this device, since the erase mode can be performed selectively on a particular group of memory cells by selecting the p-wells P1, P2 which can be determined independently of the configurations of the word lines WL1, WL2 or the bit lines BL1, BL2, the operation of this device becomes frexible. Moreover, in this device, the row decoder/word driver circuit 11 is suppulied with the word line selection signal SWL in order to select particular word lines WL1, WL2 during the selective erase mode. The signal SWL is also output from the erase selector circuit 32. Therefore, during the selective erase mode, the non-selected word lines are not charged by the row decoder/word driver circuit 11 so that the current consumption of this device in the selective erase mode is further reduced.

I claim:

1. A semiconductor memory device comprising;
   a) a plurality of word lines (WL1, WL2);
   b) a plurality of bit lines (BL1, BL"); and
   c) a plurality of memory cells (MC11, MC12) each includes a transistor (9) formed on a first semiconductor region (3) and having a floating gate (6), a control gate (8) connected to one of said word lines, a source region (5s) and a drain region (5d) connected to a first end of one of said bit lines, characteriyed by
   d) a source line (SL) having a first capacitance thereof different from a second capacitance which is associated with said bit lines (BL1, BL2) and having a first end thereof connected to said source region,
   e) a first bias means (14) for charging said bit lins and said source line via said first semicondictor region to a high voltage level (Vcc),
   f) a control means (18) for outputting a first and a second signal to said first bias means consecutively, wherein said first bias means is activated by said first signal to charge said bit lines and said source line in a first time period, said first bias means is switched to supply a low voltage level (Vss) to said first semiconductor region during a second time period, said source and drain region provide a voltage difference and a current therebetween according to said second signal owing to a difference between said first and second capacitance, by which current electrons are injected to said floating gate.

2. The semiconductor memory device as claimed in claim 1, characterized by
   a) a first switching means (22) for connecting a second end of said source line to a first high impedance node (NS) during said first time period, and
   b) a second switching means (21) for connecting a second end of each of said bit lines (BL1, BL2) to a second high impedance node (ND1, ND2) corresponding thereto during said first time period.

3. The semiconductor memory device as claimed in claim 2, wherein said transistor stores data as a threshold voltage thereof which is determined by a voltage of said floating gate, characterized in that
   said voltage of said floating gate during said second time period determines an amount of said electrons which are injected to said floating gate.

4. The semiconductor memory device as claimed in claim 3, further comprising a word driver (11), characterized in that
   said control means (18) activates said word driver during said second time period, said word driver drives said control gate, by the level of which control gate said amount of said electrons is controled.

5. The semiconductor memory device as claimed in claim 4, characterized in that
   said control circuit outputs said first and second signal alternately in ceveral times.

6. A data erase method for a semiconductor memory device which comprises:
   a) a plurality of word lines (WL1, WL2);
   b) a plurality of bit lines (BL1, BL''); and
   c) a plurality of memory cells (MC11, MC12) each includes a transistor (9) formed on a first semiconductor region (3) and having a floating gate (6), a control gate (8) connected to one of said word lines, a source region (5s) and a drain region (5d) connected to a first end of one of said bit lines, characteriyed in that
   d) a source line (SL) is provided which has a first capacitance thereof different from a second capacitance associated with said bit lines (BL1, BL2), a first end of which source line is connected to said source region,
   e) a first bias means (14) charges said bit lins and said source line via said first semicondictor region to a high voltage level (Vcc) during a first time period,
   f) said first bias means supplies a low voltage level (Vss) to said first semiconductor region during a second time period following said first time period, which causes a voltage difference and a current between said source and drain region according to a difference between said first and second capacitance, by which current electrons are injected to said floating gate.

7. The data erase method as claimed in claim 6, characterized in that
   a) a first switching means (22) connects a second end of said source line to a first high impedance node (NS) during said first time period, and
   b) a second switching means (21) connects a second end of each of said bit lines (BL1, BL2) to a second high impedance node (ND1, ND2) corresponding thereto during said first time period.

8. The data erase method as claimed in claim 7, wherein said transistor stores data as a threshold voltage thereof which is determined by a voltage of said floating gate, characterized in that
   said voltage of said floating gate during said second time period determines an amount of said electrons which are injected to said floating gate.

9. The data erase method as claimed in claim 8, wherein said semiconductor memory device further comprises a word driver (11), characterized in that
   a control means (18) activates said word driver during said second time period, said word driver drives said control gate, by the level of which control gate said amount of said electrons is controled.

10. The semiconductor memory device as claimed in claim 9, characterized in that
   said control circuit alternate activating said first bias means for charging said bit lines and said source line to said high voltage level with deactivating said first bias means for supplying said low voltage level to said first semiconductor region in several times.

* * * * *

UNITED STATES PATENT AND TRADEMARK OFFICE
CERTIFICATE OF CORRECTION

PATENT NO. : 5,406,521

DATED : April 11, 1995

INVENTOR(S) : Hideki Hara

It is certified that error appears in the above-indentified patent and that said Letters Patent is hereby corrected as shown below:

Abstract, Line 13, delete "lins" and insert --lines--.

Column 1, Line 24, delete "electlon" and insert --electron--.

Column 1, Line 25, delete "elase" and insert --erase--.

Column 1, Line 37, delete "comonn" and insert --common--.

Column 2, Line 4, delete "over-eraseand" and insert --over-erased and--

Column 2, Line 11, delete "advence" and insert --advance--.

Column 2, Line 11, delete "opertion" and insert --operation--.

Column 2, Lines 11 & 12, delete "poeration" and insert --operation--.

Column 2, Line 34, delete "pperation" and insert --operation--.

Column 2, Line 67, delete "amall" and insert --small--.

Column 3, Lines 8 and 9, delete "semicondictor" and insert --semiconductor--.

Column 3, Line 23, delete "mempry" and insert --memory--.

Column 3, Line 57, delete "insurating" insert --insulating--.

Column 3, Line 60, delete "deposotion" insert --deposition--.

UNITED STATES PATENT AND TRADEMARK OFFICE
CERTIFICATE OF CORRECTION

PATENT NO. : 5,406,521
DATED : April 11, 1995
INVENTOR(S) : Hideki Hara

It is certified that error appears in the above-indentified patent and that said Letters Patent is hereby corrected as shown below:

Column 4, Lines 36 and 37, delete "selictively" and insert --selectively--

Column 4, Line 39, delete "outpits" and insert --outputs--.

Column 4, Line 48, delete "vontage" and insert --voltage--.

Column 4, Line 51, delete "addrss" and insert --address--.

Column 5, Line 13, delete "accoding" and insert --according--.

Column 5, Line 39, delete "sognal" and insert --signal--.

Column 5, Line 58, delete "non-witten" and insert --non-written--.

Column 6, Line 18, delete "sell" and insert --cell--.

Column 6, Line 30, delete "cupplings" and insert --couplings--.

Column 6, Line 52, delete "registance" insert --resistance--.

Column 6, Line 56, delete "cupplings" and insert --couplings--.

Column 7, Line 2, delete "drived" and insert --driven--.

Column 7, Line 5, delete "transistores" and insert --transistors--.

Column 7, Line 35, delete "regilating" and insert --regulating--.

Column 7, Line 43, delete "lenes" and insert --lines--.

UNITED STATES PATENT AND TRADEMARK OFFICE
CERTIFICATE OF CORRECTION

PATENT NO. : 5,406,521

DATED : April 11, 1995

INVENTOR(S) : Hideki Hara

It is certified that error appears in the above-indentified patent and that said Letters Patent is hereby corrected as shown below:

Column 7, Line 44, delete "souce" and insert --source--.

Column 7, Line 58, delete "maintaind" and insert --maintained--.

Column 8, Line 18, delete "mannar" and insert --manner--.

Column 8, Line 19, delete the second occurrence of "the".

Column 8, Line 30, delete "frexible" and insert --flexible--.

Column 8, Lines 31 and 32, delete "suppulied" insert --supplied--.

Column 8, Line 50, delete "characteriyed" and insert --characterized--.

Column 8, Line 56, delete "lins" and insert --lines--.

Column 8, Line 57, delete "semicondictor" and insert --semiconductor--.

Column 9, Line 31, delete "ceveral" and insert --several--.

Column 9, Line 43, delete "characteriyed" and insert --characterized--.

UNITED STATES PATENT AND TRADEMARK OFFICE
CERTIFICATE OF CORRECTION

PATENT NO. : 5,406,521
DATED : April 11, 1995
INVENTOR(S) : Hideki Hara

It is certified that error appears in the above-indentified patent and that said Letters Patent is hereby corrected as shown below:

Column 10, Line 3, delete "lins" and insert --lines--.

Column 10, Line 4, delete "semicondictor" and insert --semiconductor--.

Signed and Sealed this

Thirty-first Day of October 1995

Attest:

BRUCE LEHMAN

Attesting Officer

Commissioner of Patents and Trademarks